United States Patent [19]
Sai

[11] Patent Number: 4,942,374
[45] Date of Patent: Jul. 17, 1990

[54] PHASE-LOCKED LOOP TYPE SYNTHESIZER HAVING MODULATION FUNCTION

[75] Inventor: Kenji Sai, Mitaka, Japan

[73] Assignee: Japan Radio Co., Ltd., Tokyo, Japan

[21] Appl. No.: 343,484

[22] Filed: Apr. 25, 1989

[30] Foreign Application Priority Data

Apr. 26, 1988 [JP] Japan ................. 63-103702

[51] Int. Cl.$^5$ ................. H03C 3/08; H03C 3/09
[52] U.S. Cl. ................. 332/124; 332/128; 455/76; 455/113
[58] Field of Search ................. 332/124, 128, 144; 455/112, 113, 119, 42, 75, 76

[56] References Cited

U.S. PATENT DOCUMENTS 4,052,672 10/1977 Enderby et al. ................. 332/16 R
4,242,649 12/1980 Washburn, Jr. ................. 332/128
4,313,209 1/1982 Drucker ................. 455/112

Primary Examiner—Siegfried H. Grimm
Attorney, Agent, or Firm—Frishauf, Holtz, Goodman & Woodward

[57] ABSTRACT

In a phase-locked loop type synthesizer comprising a phase-locked loop which comprises a phase comparator, a loop filter, a voltage controlled oscillator having a gain Kv, and a circuit for feeding back an output from the voltage controlled oscillator to the phase comparator through a frequency divider having a frequency division ratio N and which is supplied with first and second modulation signals at first and second sections through first and second adders, first and second gain control circuits are provided on input lines of the first and the second modulation signals, respectively. The first gain control circuit has a first gain adjusted to be in inverse proportion to the frequency division ratio N while the second gain control circuit has a second gain adjusted to be in inverse proportion to the gain Kv. Preferably, the first adder is connected between the phase comparator and the loop filter while the second adder is connected between the loop filter and the voltage controlled oscillator. If the voltage controlled oscillator is of the fixed gain type, the second gain control circuit may be omitted.

3 Claims, 5 Drawing Sheets

PHASE-LOCKED LOOP TYPE SYNTHESIZER HAVING MODULATION FUNCTION

BACKGROUND OF THE INVENTION

This invention relates to a phase-locked loop (PLL) type synthesizer with modulation function which is suitable for modulating a carrier signal by a digital signal or a voice signal. Such a synthesizer is particularly useful in a radio communication device.

A synthesizer of the type described is disclosed in U.S. Pat. No. 4,052,672 issued to Enderby et al and assigned to Motorola, Inc., and comprises a phase-locked loop circuit comprising a phase comparator, a loop filter, a voltage controlled oscillator having a gain Kv, and a circuit for feeding back a frequency signal produced from the voltage controlled oscillator to the phase comparator. The feedback operation is carried out through a frequency divider having a frequency division ratio (N). For modulation, a digital signal is supplied to a specific section of the phase-locked loop circuit as a first modulation signal through a first adding circuit. A voice signal is supplied to another section of the phase-locked loop circuit as a second modulation signal through a second adding circuit. Such a synthesizer is desirable to have a constant modulation sensitivity and a flat frequency characteristic over a wide range. The modulation sensitivity may be called audio sensitivity. The modulation sensitivity represents an input level of the modulation signal necessary for giving a predetermined reference variation to a modulated signal.

Although the synthesizer of the type described has a flat frequency characteristic over a full frequency band of the modulation signal, it tends to be influenced by the output frequency, namely, the carrier frequency, of the voltage controlled oscillator. Namely, if the voltage controlled oscillator has a wide frequency band, the frequency division ratio N of the frequency divider (or the gain Kv of the voltage controlled oscillator) varies in dependence on the carrier frequency of the voltage controlled oscillator. This means that the modulation sensitivity fluctuates in dependence on the output frequency of the voltage controlled oscillator.

In order to obtain a constant modulation sensitivity, a phase comparator of a variable gain type has been used for another type of synthesizer. Such a synthesizer is disclosed in U.S. Pat. No. 4,313,209 issued to Drucker and assigned to John Fluke Mfg. Co., Inc. In that synthesizer, a gain of the phase comparator is controlled in proportion to the frequency division ratio N and in inverse proportion to the gain Kv. Simultaneously, the input level of the modulation signal is controlled in inverse proportion to the gain Kv. Although the synthesizer has a constant modulation sensitivity, it needs a variable gain type phase comparator which is expensive.

SUMMARY OF THE INVENTION

It is therefore an object of this invention to provide a PLL type synthesizer having constant modulation sensitivity regardless of an output frequency of a voltage controlled oscillator.

It is another object of this invention to provide a PLL type synthesizer of the type described which is low in cost.

A PLL type synthesizer to which this invention is applicable comprises a PLL circuit which comprises a phase comparator, a loop filter, a voltage-controlled oscillator having a gain Kv, and a circuit for feeding back an output from the voltage-controlled oscillator to the phase comparator through a frequency divider having a frequency division ratio N, a first adder for adding a modulation signal through a compensator to an output of the phase comparator to produce a first composite signal, and a second adder for adding the modulation signal to an output of the loop filter to produce a second composite signal. The first composite signal is applied to the loop filter while the second composite signal is applied to the voltage controlled oscillator.

According to this invention, first and second gain control circuits are provided on an input line of the modulation signal for the compensator and an input line of the modulation signal for the second adder, respectively. The first gain control circuit has a first variable gain G1 adjusted to be in inverse proportion to the frequency division ratio N. The second gain control circuit has a second variable gain G2 adjusted to be in inverse proportion to the gain Kv of the voltage-controlled oscillator. dr

DESCRIPTION OF THE PREFERRED EMBODIMENTS

Figure 1:
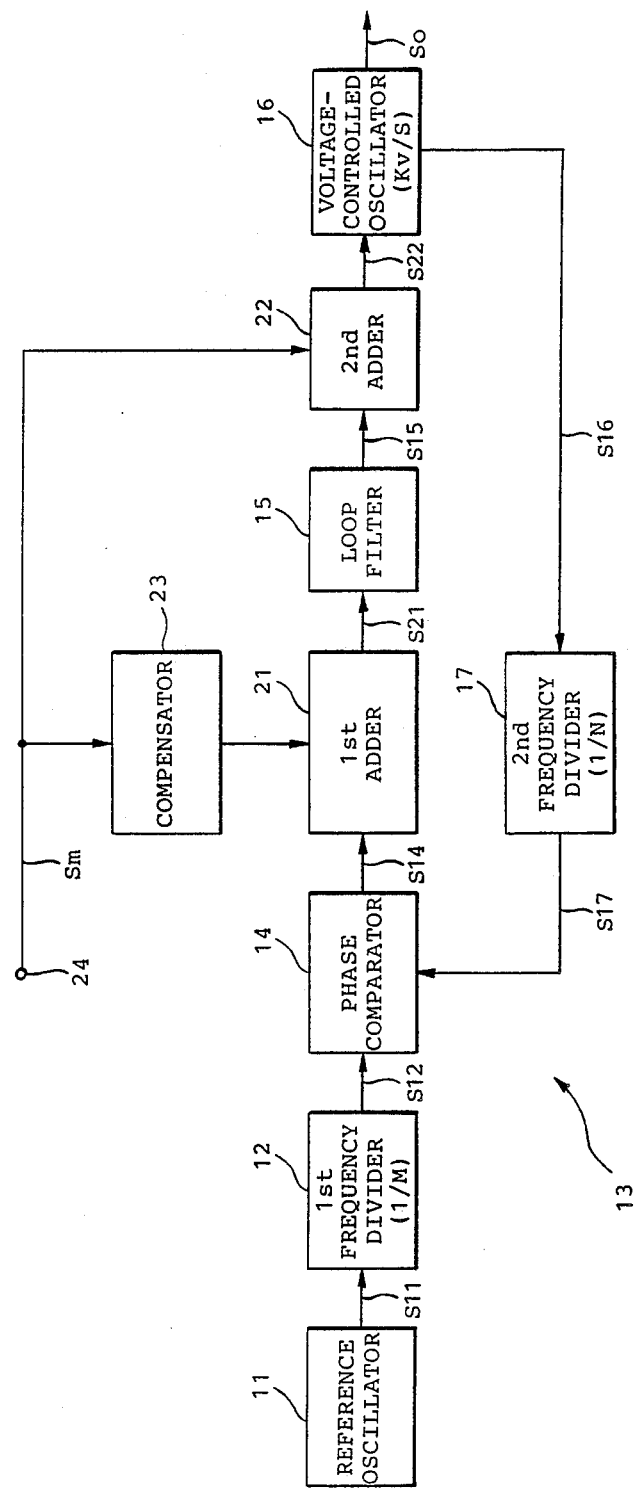
FIG. 1 is a block diagram of a conventional PLL type synthesizer.

Referring to FIG. 1, a conventional PLL type synthesizer will be described in order to facilitate a clear understanding of the present invention. The synthesizer is of the type disclosed in the U.S. Pat. No. 4,052,672 referred to hereinabove.

In FIG. 1, the synthesizer comprises a reference oscillator 11, a first frequency divider 12 having a first frequency division ratio M, and a feedback loop circuit 13. The feedback loop circuit 13 comprises a phase comparator 14, a loop filter 15 having a predetermined transfer function, a voltage controlled oscillator 16, and a second frequency divider 17 having a second frequency division ratio N and which feeds back a frequency signal S16 produced from the voltage controlled oscillator 16 to the phase comparator 14 through the second frequency divider 17.

First and second adders 21 and 22 and a compensator 23 are used for modulation, as will later be described.

A reference frequency signal S11 produced from the reference oscillator 11 is divided in frequency by the first frequency divider 12. The first frequency divider 12 supplies a first divided frequency signal S12 to the phase comparator 14. The second frequency divider 17 divides the frequency signal S16 and supplies a second divided frequency signal S17 to the phase comparator 14. The phase comparator 14 compares the first divided frequency signal S12 with the second divided frequency signal S17 and produces a phase error signal S14 as a comparison result signal.

For modulation, a modulation signal Sm, namely, a digital signal or a voice signal, is supplied to the feedback loop circuit 13 from an input terminal 24 through two circuits. A first of the two circuits is the compensator 23 which is an integrator and the first adder 21 interconnected between the phase comparator 14 and the loop filter 15. The modulation signal Sm is applied to the first adder 21 through the compensator 23 and added to the phase error signal S14 to produce a first composite signal S21 which is supplied to the loop filter 15. Supplied with the first composite signal S21, the loop filter 15 delivers a filtered signal S15 to the second adder 22.

A second of the two circuits is the second adder 22 interconnected between the loop filter 15 and the voltage controlled oscillator 16. The modulation signal Sm is applied to the second adder 22 and is added to the filtered signal S15 to produce a second composite signal S22. The second composite signal S22 is fed to the voltage controlled oscillator 16. The voltage controlled oscillator 16 produces a modulated signal So as an output signal.

The above-described synthesizer has a flat frequency characteristic over a full frequency band of the modulation signal Sm even if a voice signal and a digital signal are used for the modulation signal Sm.

However, the synthesizer has a problem that the modulation sensitivity changes when an output frequency of the voltage controlled oscillator 16, namely, a carrier frequency has a wide band. That is, the frequency division ratio N changes in dependence on the carrier frequency and the gain Kv.

Figure 2:
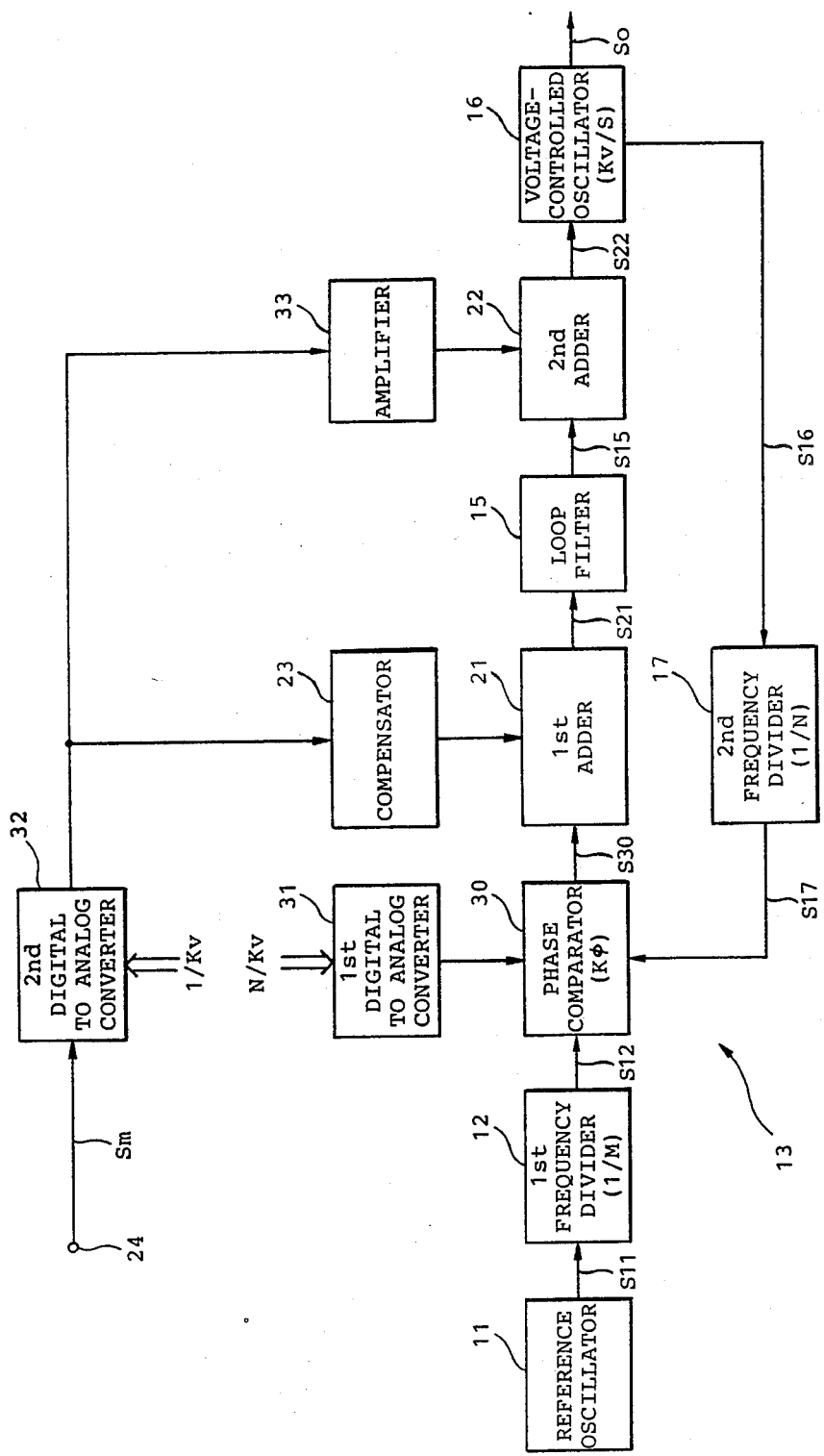
FIG. 2 is a block diagram of another conventional PLL type synthesizer.

Referring to FIG. 2, description will proceed to another conventional PLL type synthesizer disclosed in U.S. Pat. No. 4,313,209 referred to hereinabove. This synthesizer comprises similar parts designated by like reference numerals. Detailed description of such similar parts is therefore omitted.

In the synthesizer of FIG. 2, a variable gain type phase comparator 30 having a gain Kφ is used in place of the phase comparator 14 of a fixed gain type shown in FIG. 1. The gain Kφ of the phase comparator 30 is controlled by a first digital to analog converter 31. A second digital to analog converter 32 and an amplifier 33 are provided on an input line of the modulation signal Sm to control a level of the modulation signal Sm. The first digital to analog converter 31 controls the gain of the phase comparator 30 to be in proportion to the frequency division ratio N of the second frequency divider 17 but in inverse proportion to the gain Kv of the voltage controlled oscillator 16. The second digital to analog converter 32 controls the input level of the modulation signal Sm to be in inverse proportion to the gain Kv.

The synthesizer can suppress variation of the modulation sensitivity due to a wide band of the carrier frequency of the voltage controlled oscillator 16 but needs a variable gain type phase comparator which is expensive.

Figure 3:
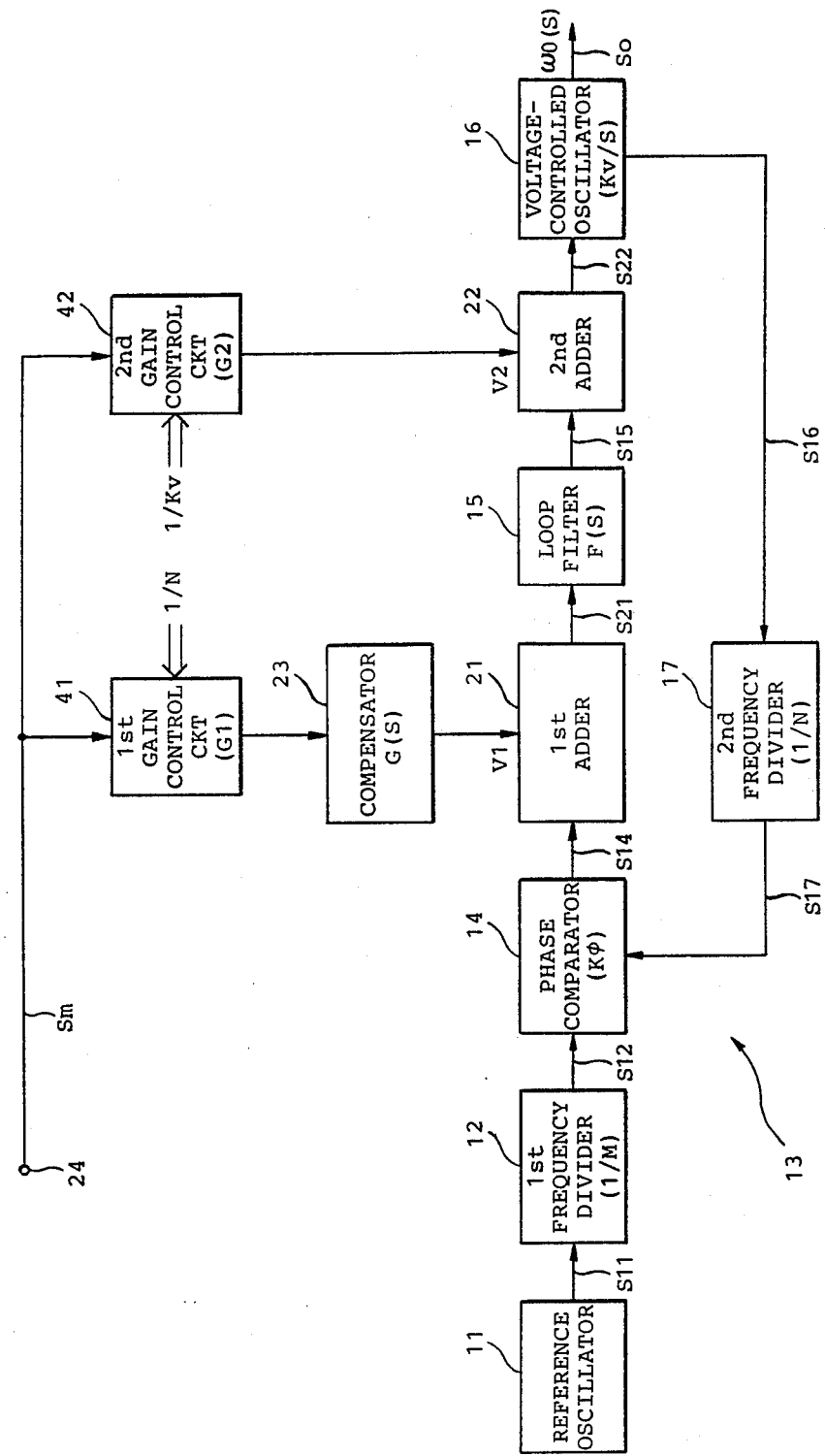
FIG. 3 is a block diagram of a PLL type synthesizer according to a first embodiment of this invention.

Referring to FIG. 3, description will be made of a PLL type synthesizer according to a first embodiment of this invention. The synthesizer of FIG. 3 is similar to that illustrated in FIG. 1 except for first and second gain control circuits 41 and 42 each of which has first and second gains G1 and G2. The first gain control circuit 41 is provided on an input line of the modulation signal Sm for the compensator 23. The compensator 23 has a predetermined transfer function G(S). On the other hand, the second gain control circuit 42 is provided on an input line of the modulation signal Sm for the second adder 22.

A reference frequency signal S11 produced from the reference oscillator 11 is divided in frequency by the first frequency divider 12. The first frequency divider 12 supplies a first divided frequency signal S12 to the phase comparator 14 having a gain Kφ. The second frequency divider 17 divides the frequency signal S16 and delivers a second divided frequency signal S17 to the phase comparator 14. The phase comparator 14 compares the first divided frequency signal S12 with the second divided frequency signal S17 and produces a phase error signal S14 as a comparison result signal.

The modulation signal Sm is supplied to the first adder 21 through the first gain control circuit 41 and the compensator 23 and is added to the phase error signal S14. The first adder 21 delivers a first composite signal S21 to the loop filter 15 having a predetermined transfer function F(S). The loop filter 15 supplies a filtered signal S15 to the second adder 22. The modulation signal Sm is also supplied to the second adder 22 through the second gain control circuit 42 and is added to the filtered signal S15. The second adder 22 delivers a second composite signal S22 to the voltage controlled oscillator 16.

The first gain G1 is controlled to be in inverse proportion to the frequency division ratio N while the second gain G2 is controlled to be in inverse proportion to the gain Kv.

The modulation characteristic of the synthesizer is given by the following equation (1):

$$\Delta\omega o(S) = Em(S) \cdot Kv \cdot G2 \cdot \left[ \frac{S + \frac{G1 \cdot G(S)}{G2} \cdot S \cdot F(S)}{S + \frac{K\phi \cdot Kv}{N} \cdot F(S)} \right], \quad (1)$$

where, $\Delta\omega o(S)$: frequency deviation of the carrier frequency in the voltage controlled oscillator 16, S: Laplacian operator, and Em(S): input level of the modulation signal Sm.

Here, it is assumed that the following equation (2) is given:

$$\frac{G1 \cdot G(S)}{G2} \cdot S = \frac{K\phi \cdot Kv}{N}, \quad (2)$$

leading to the following equation (3):

$$\Delta\omega o(S) = Em(S) \cdot Kv \cdot G2 \quad (3)$$

If $\tau$ represents a time constant of the integrator of the compensator 23 and the transfer function G(S) of the compensator 23 is given by:

$$G(S) = 1/(S \cdot \tau),$$

equation (2) is rewritten as:

$$\frac{G1}{G2 \cdot \tau \cdot K\phi} = \frac{Kv}{N}. \quad (4)$$

From equation (4), the following equation (5) is obtained:

$$G1 = G2 \cdot \tau \cdot K\phi \cdot Kv/N, \quad (5)$$

If equation (5) is satisfied and if Kv·G2 in the right side of equation (3) is made constant, that is, following equation (6) is satisfied:

$$Kv \cdot G2 = C, \quad (6)$$

where C represents a constant, the frequency deviation $\Delta\omega o(S)$ can be made constant and flat in no relation to the carrier frequency and the frequency of the modulation signal Sm.

From equation (6), the following equation (7) is obtained:

$$G2 = C/Kv \quad (7)$$

Applying equation (7) to equation (5), $$G1 = \frac{C \cdot \tau \cdot K\phi}{N} = \frac{\beta}{N} \quad (8)$$

is obtained, where $\beta = C \cdot \beta \cdot K\phi$.

It will be understood from equations (7) and (8) that the object of the invention can be realized by controlling G1 and G2 in inverse proportion to the frequency division ratio N and the gain Kv, respectively. The control is realized by the use of a central processing unit (not shown) known in the art. That is, the central processing unit controls the gains G1 and G2 of the first and the second gain control circuits 41 and 42 to be in inverse proportion to data of the frequency division ratio N and the gain Kv input thereto, respectively.

Figure 4:
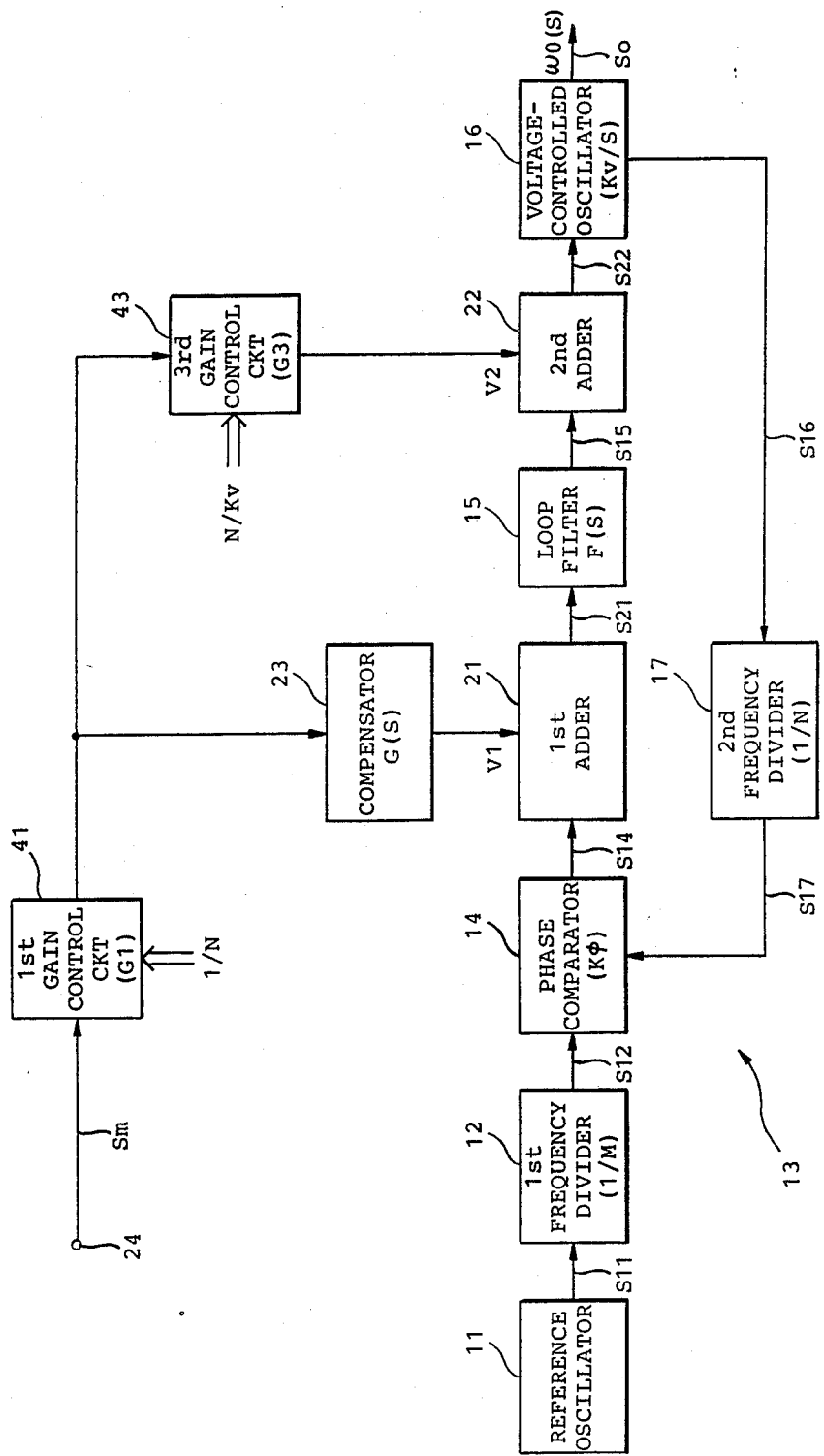
FIG. 4 is a block diagram of a PLL type synthesizer according to another aspect of this invention.

Referring to FIG. 4, description will proceed to another aspect of the PLL type synthesizer described in conjunction with FIG. 3. The synthesizer of FIG. 4 is similar to that illustrated in FIG. 3 except for the first and the third gain control circuits 41 and 43 each of which has first and third gains G1 and G3 (=G2/G1).

In the synthesizer of FIG. 4, the first gain control circuit 41 is provided on an input line of the modulation signal Sm common for the compensator 23 and the second adder 22. The gain G1 is controlled in inverse proportion to the frequency division ratio N. On the other hand, the third gain control circuit 43 is provided on an input line of the modulation signal Sm for the second adder 22. The gain G3 is controlled in proportion to the frequency division ratio N but in inverse proportion to the gain Kv of the voltage controlled oscillator 16.

In FIG. 3, input voltages V1 and V2 to the first and the second adders 21 and 22 are represented by:

$$V1 = Em(S) \cdot G1 \cdot G(S) \alpha C1/N$$

$$V2 = Em(S) \cdot G2 \propto 1/Kv$$

On the other hand, input voltages V1 and V2 in the circuit in FIG. 4 are given by:

$$V1 = Em(S) \cdot G1 \cdot G(S) \alpha 1/N$$
$$V2 = Em(S) \cdot G1 \cdot G3 \alpha (1/N) \cdot (N/Kv)$$
$$= Em(S) \cdot G2 \alpha 1/Kv,$$

because G3=G2/G1.

The above-described gain control operation is carried out by a central processing unit described in conjunction with FIG. 3. Thus, it is possible to obtain a constant modulation sensitivity with no use of a variable gain type phase comparator.

Figure 5:
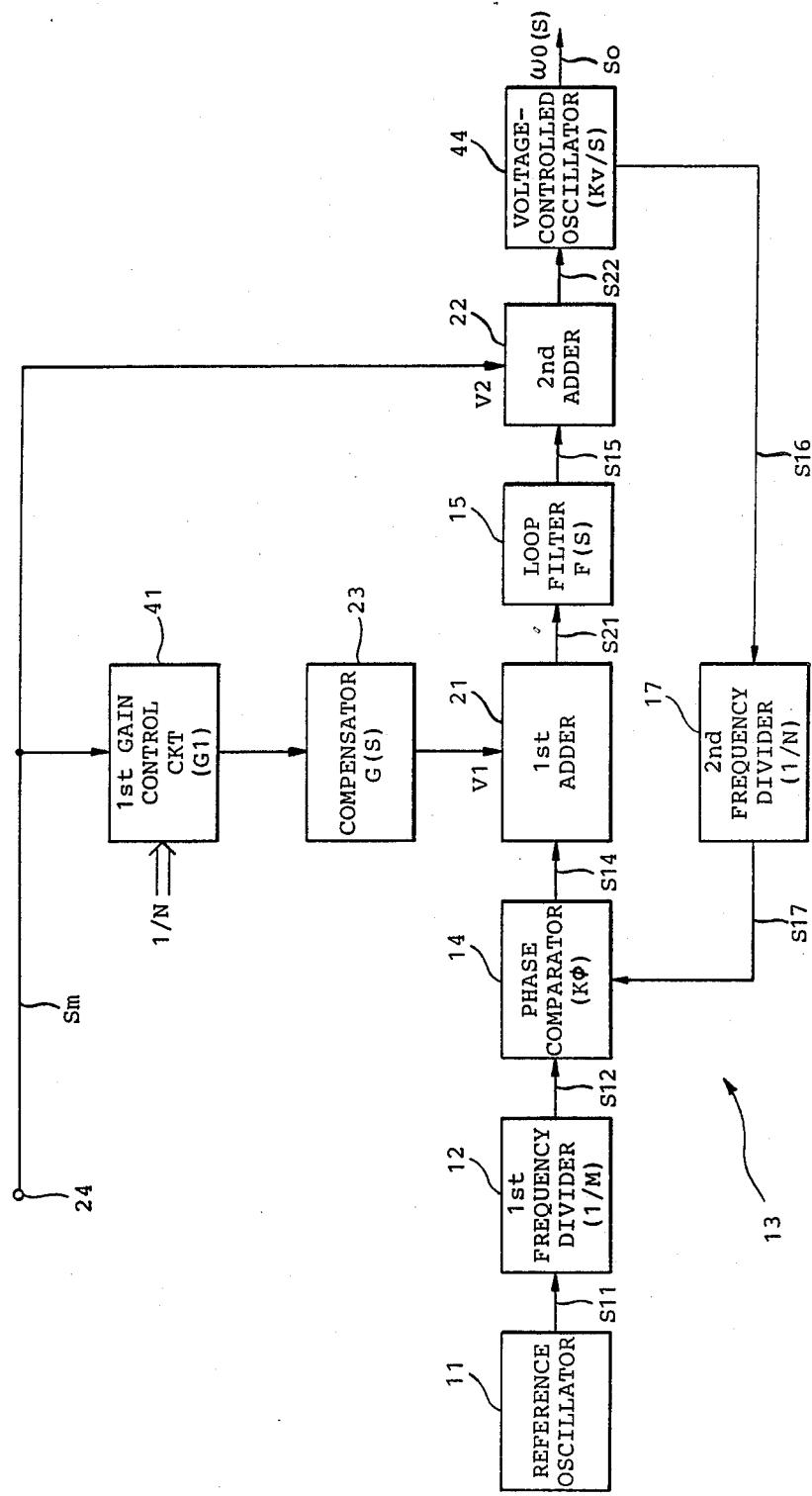
FIG. 5 is a block diagram of a PLL type synthesizer according to a second embodiment of this invention.

Referring to FIG. 5, description will be made of a PLL type synthesizer according to a second embodiment of this invention. The synthesizer is similar to that illustrated in FIG. 3 except that the second gain control circuit 42 is omitted and that a fixed gain type voltage controlled oscillator 44 is used in place of the voltage controlled oscillator 16 shown in FIG. 3. This is based on the following reasoning.

In FIG. 3, if the gain Kv of the voltage controlled oscillator 16 is made constant in no relation to the carrier frequency, it is possible to make the second gain G2 constant. In this case, the first gain G1 may only be controlled in inverse proportion to the frequency division ratio N. Thus, the second gain control circuit can be omitted by using a fixed gain type voltage controlled oscillator 44. Such a voltage controlled oscillator is disclosed in Japanese Published Unexamined Utility Model Application No. 48112/83 (Kokai Sho 58-48112 Gou) assigned to the present assignee.

While this invention has been described in conjunction with preferred embodiments thereof, it will readily be possible for those skilled in the art to put this invention into practice in various other manners. For example, the PLL circuit may comprise other components.

What is claimed is:

1. In a phase-locked loop type synthesizer comprising a phase-locked loop circuit which comprises a phase comparator, a loop filter, a voltage controlled oscillator having a gain Kv, a circuit for feeding back an output from said voltage controlled oscillator to said phase comparator through a frequency divider having a frequency division ratio N, a first adder for adding a modulation signal through a compensator to an output of said phase comparator to produce a first composite signal, said first composite signal being applied to said loop filter, and a second adder for adding said modulation signal to an output of said loop filter to produce a second composite signal, said second composite signal being applied to said voltage controlled oscillator, the improvement wherein:
first and second gain control circuits are coupled in an input line of said modulation signal for said compensator and an input line of said modulation signal for said second adder, respectively;
said first gain control circuit having a first variable gain G1 which is adjusted to be in inverse proportion to said frequency division ratio N of said frequency divider; and
said second gain control circuit having a second variable gain G2 which is adjusted to be in inverse proportion to said gain Kv of said voltage controlled oscillator.

2. In a phase-locked loop type synthesizer comprising a phase-locked loop circuit which comprises a phase comparator, a lop filter, a voltage controlled oscillator having a gain Kv, a circuit for feeding back an output from said voltage controlled oscillator to said phase comparator through a frequency divider having a frequency division ratio N, a first adder for adding a modulation signal through a compensator to an output of said phase comparator to produce a first composite signal, said first composite signal being applied to said loop filter, and a second adder for adding said modulation signal to an output of said loop filter to produce a second composite signal, said second composite signal being applied to said voltage controlled oscillator, the improvement wherein:

said voltage controlled oscillator has a fixed gain; and a gain control circuit is coupled in an input line of said modulation signal for said compensator, said gain control circuit having a variable gain G1 which is adjusted to be in inverse proportion to said frequency division ratio N of said frequency divider.

3. In a phase-locked loop type synthesizer comprising a phase-locked loop circuit which comprises a phase comparator, a loop filter, a voltage controlled oscillator having a gain Kv, a circuit for feeding back an output from said voltage controlled oscillator to said phase comparator through a frequency divider having a frequency division ratio N, a first adder for adding a modulation signal through a compensator to an output of said phase comparator to produce a first composite signal, said first composite signal being applied to said loop filter, and a second adder for adding said modulation signal to an output of said loop filter to produce a second composite signal, said second composite signal being applied to said voltage controlled oscillator, the improvement wherein:

a first gain control circuit is coupled in a common input line of said modulation signal for said compensator and said second adder, and said first gain control circuit having a first variable gain which is controlled to be in inverse proportion to said frequency division ratio N; and a second gain control circuit is coupled in the input line of said modulation signal for said second adder such that an output of said first gain control circuit is coupled to an input of said second gain control circuit, said second gain control circuit having a second variable gain related to said first variable gain, said second variable gain being adjusted to be in proportion to said frequency division ratio N of said frequency divider but in inverse proportion to said gain Kv of said voltage controlled oscillator.

* * * * *